United States Patent
Milhau et al.

(10) Patent No.: US 11,400,604 B2
(45) Date of Patent: Aug. 2, 2022

(54) GRIPPING DEVICE WITH MONITORING OF THE OPERATING STATE THEREOF

(71) Applicant: COVAL, Montelier (FR)

(72) Inventors: Pierre Milhau, Chatuzange-le-Goubet (FR); Michel Cecchin, Montelier (FR)

(73) Assignee: COVAL, Montelier (FR)

( * ) Notice: Subject to any disclaimer, the term of this patent is extended or adjusted under 35 U.S.C. 154(b) by 145 days.

(21) Appl. No.: 16/766,191

(22) PCT Filed: Nov. 19, 2018

(86) PCT No.: PCT/EP2018/081694
§ 371 (c)(1),
(2) Date: Jul. 20, 2020

(87) PCT Pub. No.: WO2019/101668
PCT Pub. Date: May 31, 2019

(65) Prior Publication Data
US 2020/0361098 A1  Nov. 19, 2020

(30) Foreign Application Priority Data
Nov. 22, 2017  (FR) ..................................... 1761045

(51) Int. Cl.
*B25J 15/06* (2006.01)
*G01R 27/02* (2006.01)
(Continued)

(52) U.S. Cl.
CPC .......... *B25J 15/0683* (2013.01); *G01R 27/02* (2013.01); *B25J 9/1674* (2013.01); *B65G 47/91* (2013.01);
(Continued)

(58) Field of Classification Search
CPC .... B25J 15/0683; B25J 9/1674; B25J 13/087; B65G 47/91; B65G 47/917; B65G 47/918;
(Continued)

(56) References Cited

U.S. PATENT DOCUMENTS 5,172,949 A * 12/1992 Nagai .................... B65G 47/91
294/185
8,534,730 B2 * 9/2013 Strohmayr ............ B66C 1/0281
294/188
2017/0057091 A1 * 3/2017 Wagner .................. B25J 9/1694

FOREIGN PATENT DOCUMENTS

| EP | 2835085 A1 | 2/2015 |
| JP | H11114863 A | 4/1999 |
| JP | 2008149435 A | 7/2008 |

* cited by examiner

Primary Examiner — Dean J Kramer
(74) Attorney, Agent, or Firm — Muncy, Geissler, Olds & Lowe, P.C.

(57) ABSTRACT

A vacuum gripper device including at least one suction cup including a fastener body from which there extends an elastically deformable skirt having a free annular edge for coming into contact with an object to be grasped. The suction cup includes at least one electrically conductive track secured at least to the skirt. The conductive track is made of a material that is electrically conductive and elastically deformable so as to deform together with the skirt. The device includes an electronic processor circuit that is connected electrically to two connection pads belonging to the conductive track and that is arranged to monitor an electrical property of the conductive track, which electrical property varies with the deformation of the conductive track, and to compare that property with reference data so as to anticipate a failure of the suction cup.

31 Claims, 2 Drawing Sheets

(51) Int. Cl.
*B25J 9/16* (2006.01)
*B65G 47/91* (2006.01)
*G06F 11/00* (2006.01)

(52) U.S. Cl.
CPC ...... *B65G 2249/045* (2013.01); *G06F 11/004* (2013.01)

(58) Field of Classification Search
CPC .. B65G 2249/045; G01R 27/02; G06F 11/004
USPC ..................................................... 294/185
See application file for complete search history.

GRIPPING DEVICE WITH MONITORING OF THE OPERATING STATE THEREOF

The present invention relates to the field of gripping objects, in particular in industry.

STATE OF THE ART

Gripper devices are known that comprise suction cups including a fastener body from which there extends an elastically deformable skirt having a free annular edge for coming into contact with an object that is to be grasped. The fastener bodies, which are tubular in shape, are mounted on a movable structure and they are connected individually or collectively to a vacuum source. By way of example, the movable structure is mounted on the movable end of a robot that is controlled to move the object from an initial position, in which the vacuum source is activated and the suction cups are applied against the object, towards a final position in which the vacuum source is deactivated so that the object is released by the suction cups. Optionally, when in the final position, air is expelled by the suction cup in order to accelerate release of the object.

While taking hold of the object, the annular edge of the skirt is applied against the outside surface of the object, thereby defining an airtight chamber from which air is sucked by the vacuum generator. The object is then dragged towards the movable structure, causing the skirt to be deformed (similar to flattening). This deformation is repeated on each cycle in which an object is taken hold of and then released. The increasing number of cycles ends up by causing the skirt to crack as a result of fatigue. This leads to difficulties in maintaining a vacuum in the airtight chamber that is formed when taking hold of the object, thereby increasing the consumption of air, and in the long run potentially preventing the object from being grasped.

OBJECT OF THE INVENTION

An object of the invention is to provide means for improving the reliability of the gripper device.

BRIEF SUMMARY OF THE INVENTION

For this purpose, the invention provides a vacuum gripper device comprising at least one suction cup (100) including a fastener body (110) from which there extends an elastically deformable skirt (120) having a free annular edge (122) for coming into contact with an object to be grasped, the device being characterized in that the suction cup includes at least one electrically conductive track (200) secured at least to the skirt, in that the conductive track is made of a material that is electrically conductive and elastically deformable so as to deform together with the skirt, and in that the device comprises an electronic processor circuit (300) that is connected electrically to two connection pads (210) belonging to the conductive track and that is arranged to monitor an electrical property of the conductive track, which electrical property varies with the deformation of the conductive track, and to compare that property with reference data so as to anticipate a failure of the suction cup.

Thus, the skirt and the conductive track deform together and the electrical property varies with the deformation. As a result, monitoring the electrical property makes it possible to count the number of cycles. Also, tests can be used to determine normal variation in the electrical property, such that any abnormal variation of that electrical property reveals an anomaly, such as aging or wear of the material constituting the conductive track.

By way of example, the electrical property may be resistance.

The resistance of the conductive track depends on the section of said track. The deformation leads to a reduction of this section, and thus of the resistance of the conductive track.

Advantageously, the connection pads of the conductive track are secured to the body.

Since the body is a stationary portion of the suction cup, connection is made more easily and is subjected to relatively little stress, thereby making connection more reliable.

Other characteristics and advantages of the invention appear on reading the following description of particular, nonlimiting embodiments of the invention.

BRIEF DESCRIPTION OF THE FIGURES

Reference is made to the accompanying drawings, in which.

DETAILED DESCRIPTION OF THE INVENTION

Figure 1:
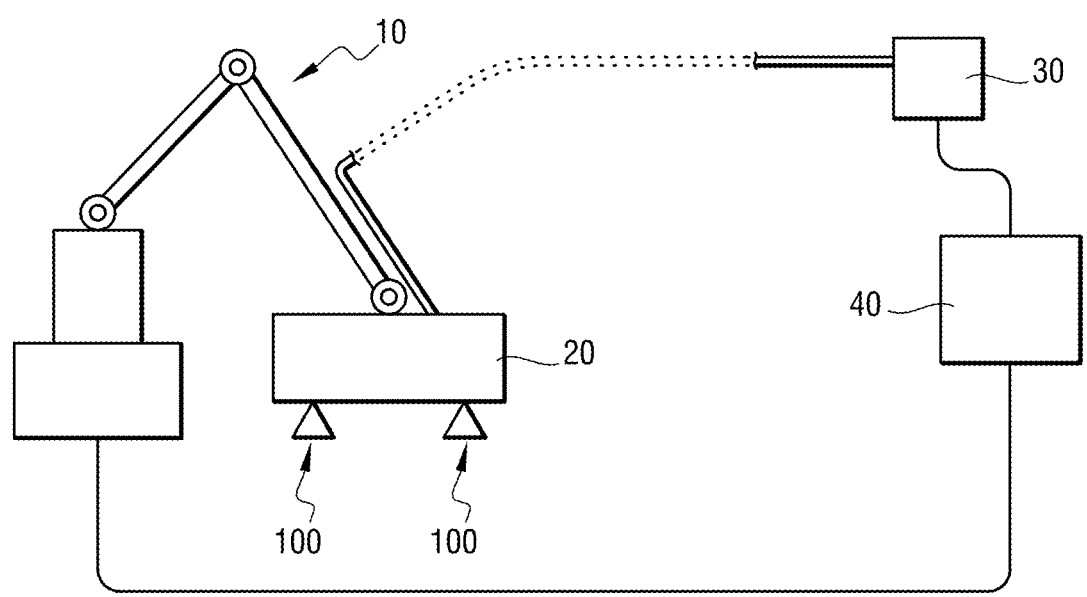
FIG. 1 is a diagrammatic perspective view of a gripper device of the invention.

With reference to the figures, the vacuum gripper device of the invention comprises a handling robot 10 having a movable portion carrying an airtight box 20 and defining a duct that is connected to a vacuum source 30. The handling robot 10 and the vacuum source 30 are controlled by an electronic control unit 40. This type of arrangement is itself known, and it is not described in greater detail herein.

The box 20 is provided with suction cups generally referenced 100. Each suction cup 100 comprises a fastener body 110 from which there extends an elastically deformable skirt 120. The fastener body 110 is tubular in shape and it receives a metal tubular insert enabling the suction cup 100 to be fastened to the box 20, and enabling the suction cup 100 to be put into fluid flow communication with the duct that is connected to the vacuum source 30. The skirt 120 comprises a main portion, in the form of a substantially frustoconical annular bellows, made of a material that is elastically deformable and electrically insulating, and having an edge 121 of small section connected to the fastener body 110 and an edge 122 of large section forming a free annular edge of the skirt 120 for coming into contact with an object that is to be grasped. In this example, the fastener body 110 and the skirt 120 of the suction cup 100 comprise a single piece of an elastomer material such as nitrile rubber.

Each suction cup 100 includes at least one electrically conductive track 200 that possesses connection pads 210 secured to the fastener body 110 and a main segment 220 that is secured to the main portion of the skirt 120 and that connects together the connection pads 210. Each conductive track 200 is made of a material that is electrically conductive and elastically deformable so as to deform together with the skirt 120.

In this example, the electrically conductive track 200 comprises a layer of electrically conductive material affixed on the main portion of the skirt 120 and on the fastener body 110. The electrically conductive material (where the term "conductive" also includes materials that are semi-conductive) is deposited on the outside surface of the suction cup 200 (however it could be deposited on the inside surface, as well or as an alternative) in the form of a layer that is more or less fine, being of thickness that may be constant or otherwise. The flexibility of the electrically conductive material layer is preferably identical to the flexibility of the material constituting the skirt of the suction cup. The conductive (or semi-conductive) layer may be of various kinds and may be deposited using various methods, e.g. such as:

depositing or spraying a conductive (or semi-conductive) paint;

depositing, spraying, sputtering, or transferring a conductive (or semi-conductive) ink; and depositing or spraying (plasma bombarding) conductive particles.

This list is not exhaustive, there exist other possible substances or compounds and other possible deposition methods.

Under certain circumstances, the electrically conductive layer deposited on the suction cup may be insulated and protected from chemical attack from the environment by adding a top layer of a protective agent such as a varnish, etc. . . .

This adhesive layer is preferably positioned on the zones of the suction cup that are at risk in patterns, which patterns may present a variety of shapes.

Figure 2:
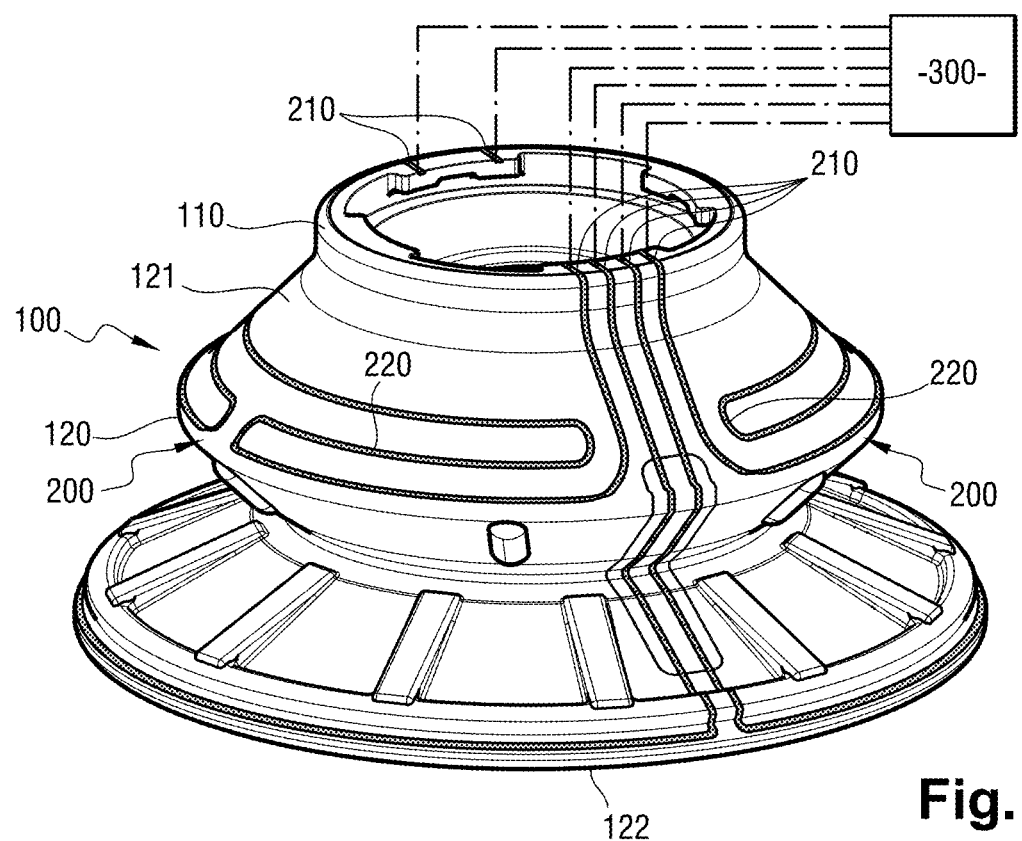
FIG. 2 is a perspective view of a suction cup in a first embodiment of the device.

In FIG. 2, the main segment 220 of the electrically conductive track 200 is in the form of a long narrow strip extending circumferentially over the main portion of the skirt 120 forming convolutions from the annular edge 122 to the annular edge 121.

Figure 3:
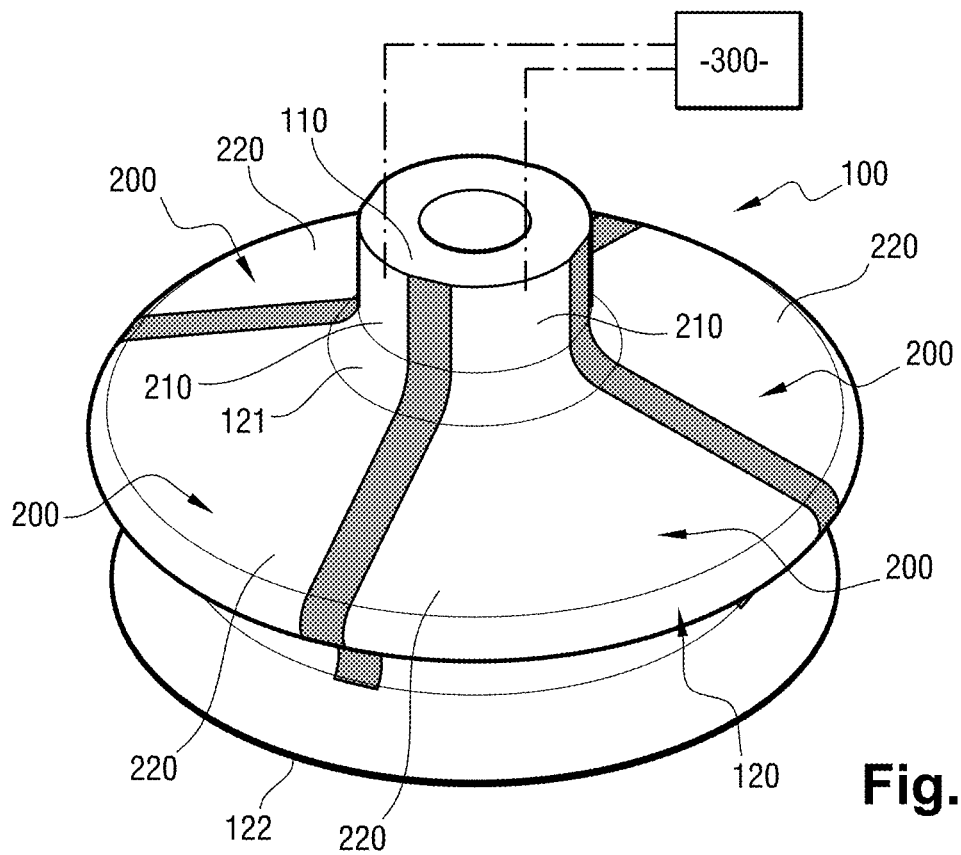
FIG. 3 is a diagrammatic perspective view of a suction cup in a second embodiment of the device.

In FIG. 3, the main segment 220 of the electrically conductive track 200 occupies a surface area, and more particularly it forms an angular sector. There are four conductive tracks: in their top portions, the four sectors are separated in pairs by electrically insulating portions, and they are connected together along the edge 122.

These shapes are not limiting and they also depend on the geometrical shapes of the suction cup and of the zones that are to be monitored. The electrically conductive track could thus equally well combine shapes that are linear and shapes that occupy surface areas.

In this example, each suction cup 100 of the device includes an electronic processor circuit 300 that is connected electrically to the two connection pads 210 belonging to the conductive track 200 and that is arranged both to monitor an electrical property of the conductive track 200, which electrical property varies with deformation of the conductive track 200, and also to compare that property with reference data so as to anticipate a failure of the suction cup. The monitored electrical property is resistance. The reference data comprises values for that resistance as a function of a number of deformation cycles. The electronic processor circuit 300 comprises a member for measuring resistance (an ohmmeter), a memory containing a processing program, reference data, and measured data, a processor that executes the processing program and that is connected to the member for measuring current, and a battery for providing power. The processing program is arranged to act periodically to measure the resistance of the conductive track 200, to respond to variation in the measured resistance value to identify a deformation cycle (or an operating cycle that comprises, during suction, deformation from a rest state to a deformed state, followed, during release, by deformation from the deformed state to the rest state), to determine the number of deformation cycles that have already been performed, to compare the resistance values measured for this number of deformation cycles with the reference data, and to issue a warning when the number of deformation cycles reaches a predetermined threshold and/or when the measured resistance values differ from the values of the reference data. The processing program could be arranged differently, and in a simpler version, for example, it could be arranged to act periodically to measure the resistance of the conductive track 200, to compare the measured resistance values and their variation with the reference data, and to issue a warning when the measured resistance values and/or their variation differ from the values or the variation of the reference data. In this example, the electronic processor circuit 300 is mounted on the fastener body 110 of the suction cup 100. The electronic processor circuit 300 is also provided with a connection member for connecting to the electronic control unit 40 of the device. The connection member may be arranged to set up a wired connection or a wireless connection with the electronic control device 40.

The section of the layer of electrically conductive material and the electrically conductive material itself together define a resistance value when the suction cup is in the rest state (i.e. the non-deformed state).

While the suction cup is in use, the skirt 120 of the suction cup 100 and the main segment 220 of the electrically conductive track 200 deform together under the effect of the suction and of the mechanical stresses during the gripping cycle. This causes the measured resistance to vary in real time, thereby generating a dynamic curve for the cycle as a function of time. As a result of aging after several thousand cycles, the polymer of the suction cup becomes degraded. There are several causes of degradation, in particular both chemical causes and mechanical causes, and they have the consequence of modifying the dynamic behavior of the deformation of the suction cup, and thus de facto of the measured resistance curve. By comparing the resistance curve for the electrically conductive track of the suction cup when in the new state during initial cycles (forming a reference resistance curve) with the resistance curve for the electrically conductive track of the suction cup after several thousand cycles, possibly while also taking account of aging characteristics as determined theoretically or empirically, it becomes possible to diagnose the more or less advanced state of suction cup fatigue, and thus warn operators and the maintenance service of imminent risks of failure. It is thus possible, by scheduling a preventative maintenance operation, to avoid waiting for severe deterioration of the suction cup prior to proceeding with its replacement.

Naturally, the invention also makes it possible to detect any deterioration of the suction cup that leads to a local reduction in the section of the electrically conductive track, such as the suction cup being torn or excessive abrasion of the edge 122 of the suction cup.

It should be observed that the electrically conductive track or layer can operate as a pressure sensor. Specifically, the typical difference of resistance as measured between a suction cup in the rest state and the same suction cup when subjected to a vacuum, serves to give an indication about the value of the suction therein.

Naturally, the invention is not limited to the embodiments described and covers any variant coming within the ambit of the invention as defined by the claims.

In particular, the structure of the device may be different from that described.

By way of example, the device may include a Venturi ejector or a plurality of Venturi ejectors, each provided with one or more suction cups.

The conductive track 200 may extend over the skirt only.

For a device having a plurality of suction cups, each provided with a conductive track, the electronic processor circuit may be common to a plurality of suction cups and may thus be connected to the conductive tracks of those suction cups.

The electronic processor circuit 300 may be integrated in the electronic control unit of the device, or it may be separate therefrom.

The electronic processor circuit may be located in the suction cup itself, in the insert of the suction cup, or on the contrary it may be separate from the suction cup.

The suction cup may be of a shape different from that described, and by way of example it may have a cross-section that is circular or oblong, it may form a single bellows or multiple bellows, etc.

The invention claimed is:

1. A vacuum gripper device comprising at least one suction cup including a fastener body from which there extends an elastically deformable skirt having a free annular edge for coming into contact with an object to be grasped, wherein the suction cup includes at least one electrically conductive track secured at least to the skirt, the conductive track is made of a material that is electrically conductive and elastically deformable so as to deform together with the skirt, and the device comprises an electronic processor circuit that is connected electrically to two connection pads belonging to the conductive track and that is arranged to monitor an electrical property of the conductive track, which electrical property varies with the deformation of the conductive track, and to compare that property with reference data so as to anticipate a failure of the suction cup, wherein the connection pads of the conductive track are secured to the fastener body.

2. A device according to claim 1, wherein the monitored electrical property is resistance.

3. A device according to claim 1, wherein the electronic processor circuit is mounted on the fastener body of the suction cup.

4. A device according to claim 1, wherein the electrically conductive track is in the form of a strip.

5. A device according to claim 1, wherein the electrically conductive track occupies a surface area.

6. A device according to claim 1, wherein the electronic processor circuit is provided with a connection member for connecting to an electronic control unit of the device.

7. A vacuum gripper device comprising at least one suction cup including a fastener body from which there extends an elastically deformable skirt having a free annular edge for coming into contact with an object to be grasped, wherein the suction cup includes at least one electrically conductive track secured at least to the skirt, the conductive track is made of a material that is electrically conductive and elastically deformable so as to deform together with the skirt, and the device comprises an electronic processor circuit that is connected electrically to two connection pads belonging to the conductive track and that is arranged to monitor an electrical property of the conductive track, which electrical property varies with the deformation of the conductive track, and to compare that property with reference data so as to anticipate a failure of the suction cup, wherein the skirt comprises a main portion of annular shape made of a material that is elastically deformable and electrically insulating, and the electrically conductive track comprises a layer of electrically conductive material affixed on the main portion.

8. A device according to claim 7, wherein the electrically conductive material is a conductive ink, a conductive paint, or conductive particles.

9. A device according to claim 7, wherein the monitored electrical property is resistance.

10. A device according to claim 7, wherein the electronic processor circuit is mounted on the fastener body of the suction cup.

11. A device according to claim 7, wherein the electrically conductive track is in the form of a strip.

12. A device according to claim 7, wherein the electrically conductive track occupies a surface area.

13. A device according to claim 7, wherein the electronic processor circuit is provided with a connection member for connecting to an electronic control unit of the device.

14. A vacuum gripper device comprising at least one suction cup including a fastener body from which there extends an elastically deformable skirt having a free annular edge for coming into contact with an object to be grasped, wherein the suction cup includes at least one electrically conductive track secured at least to the skirt, the conductive track is made of a material that is electrically conductive and elastically deformable so as to deform together with the skirt, and the device comprises an electronic processor circuit that is connected electrically to two connection pads belonging to the conductive track and that is arranged to monitor an electrical property of the conductive track, which electrical property varies with the deformation of the conductive track, and to compare that property with reference data so as to anticipate a failure of the suction cup, and a plurality of suction cups, each provided with an electrically conductive track and with an electronic processor circuit connected to the conductive tracks of the suction cup.

15. A device according to claim 14, wherein the monitored electrical property is resistance.

16. A device according to claim 14, wherein the electronic processor circuit is mounted on the fastener body of the suction cup.

17. A device according to claim 14, wherein the electrically conductive track is in the form of a strip.

18. A device according to claim 14, wherein the electrically conductive track occupies a surface area.

19. A device according to claim 14, wherein the electronic processor circuit is provided with a connection member for connecting to an electronic control unit of the device.

20. A vacuum gripper device comprising at least one suction cup including a fastener body from which there extends an elastically deformable skirt having a free annular edge or coming into contact with an object to be grasped, wherein the suction cup includes at least one electrically conductive track secured at least to the skirt, the conductive track is made of a material that is electrically conductive and elastically deformable so as to deform together with the skirt, and the device comprises an electronic processor circuit that is connected electrically to two connection pads belonging to the conductive track and that is arranged to monitor an electrical property of the conductive track, which electrical property varies with the deformation of the conductive track, and to compare that property with reference data so as to anticipate a failure of the suction cup, wherein the electronic processor circuit is arranged to diagnose the state of the suction cup by comparing a reference resistance curve for the electrically conductive track with a resistance curve of the conductive track as measured while the device is in operation.

21. A device according to claim 20, wherein the monitored electrical property is resistance.

22. A device according to claim 20, wherein the electronic processor circuit is mounted on the fastener body of the suction cup.

23. A device according to claim 20, wherein the electrically conductive track is in the form of a strip.

24. A device according to claim 20, wherein the electrically conductive track occupies a surface area.

25. A device according to claim 20, wherein the electronic processor circuit is provided with a connection member for connecting to an electronic control unit of the device.

26. A vacuum gripper device comprising at least one suction cup including a fastener body from which there extends an elastically deformable skirt having a free annular edge for coming into contact with an object to be grasped, wherein the suction cup includes at least one electrically conductive track secured at least to the skirt, the conductive track is made of a material that is electrically conductive and elastically deformable so as to deform together with the skirt, and the device comprises an electronic processor circuit that is connected electrically to two connection pads belonging to the conductive track and that is arranged to monitor an electrical property of the conductive track, which electrical property varies with the deformation of the conductive track, and to compare that property with reference data so as to anticipate a failure of the suction cup, wherein the electronic processor circuit is arranged to act periodically to measure the resistance of the conductive track, to identify a deformation cycle from variation in the measured value of the resistance, to determine the number of deformation cycles that have already been performed, to compare the measured values of resistance for this number of deformation cycles with the reference data, and to issue a warning when the number of deformation cycles reaches a predetermined threshold and/or when the measured values of resistance differ from the values of the reference data.

27. A device according to claim 26, wherein the monitored electrical property is resistance.

28. A device according to claim 26, wherein the electronic processor circuit is mounted on the fastener body of the suction cup.

29. A device according to claim 26, wherein the electrically conductive track is in the form of a strip.

30. A device according to claim 26, wherein the electrically conductive track occupies a surface area.

31. A device according to claim 26, wherein the electronic processor circuit is provided with a connection member for connecting to an electronic control unit of the device.

* * * * *